United States Patent
Kim et al.

(10) Patent No.: US 6,995,453 B2
(45) Date of Patent: Feb. 7, 2006

(54) HIGH VOLTAGE INTEGRATED CIRCUIT INCLUDING BIPOLAR TRANSISTOR WITHIN HIGH VOLTAGE ISLAND AREA

(75) Inventors: Jong-jib Kim, Seoul (KR); Chang-ki Jeon, Kimpo (KR); Sung-lyong Kim, Suwon (KR); Young-suk Choi, Boocheon (KR); Min-hwan Kim, Boocheon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 10/241,818

(22) Filed: Sep. 10, 2002

(65) Prior Publication Data

US 2003/0168710 A1 Sep. 11, 2003

(30) Foreign Application Priority Data

Mar. 9, 2002 (KR) ................................ 2002-12735

(51) Int. Cl.
*H01L 27/102* (2006.01)
*H01L 29/70* (2006.01)

(52) U.S. Cl. ..................................... 257/552; 257/557
(58) Field of Classification Search ................ 257/47, 257/205, 273, 350, 378, 553, 556–562, 565–593, 257/552
See application file for complete search history.

(56) References Cited

U.S. PATENT DOCUMENTS 6,022,778 A * 2/2000 Contiero et al. ............ 438/268

* cited by examiner

*Primary Examiner*—Howard Weiss
*Assistant Examiner*—Marcos D. Pizarro-Crespo
(74) *Attorney, Agent, or Firm*—Townsend and Townsend and Crew LLP

(57) ABSTRACT

In a high voltage integrated circuit, a low voltage region is separated from a high voltage region by a junction termination. A bipolar transistor in the high voltage region is surrounded by an isolation region having a low doping concentration. The use of a low-doped isolation region increases the size of an active region without reduction of a breakdown voltage.

11 Claims, 6 Drawing Sheets

US 6,995,453 B2

HIGH VOLTAGE INTEGRATED CIRCUIT INCLUDING BIPOLAR TRANSISTOR WITHIN HIGH VOLTAGE ISLAND AREA

CROSS-REFERENCE TO RELATED APPLICATIONS

This application claims priority to Korean patent application number 02-12735, filed Mar. 9, 2002, which is incorporated herein by reference.

BACKGROUND OF THE INVENTION

1. Field of the Invention

The present invention relates to the field of high voltage integrated circuits, and more particularly, to a high voltage integrated circuit including a bipolar transistor within high voltage island area.

2. Description of the Related Art

High voltage integrated circuits (HVIC) provide many advantages to power control systems such as electronic ballasts, switch power supplies, and motor drives. A high voltage integrated circuit typically includes a high voltage portion, a low voltage portion and a junction termination between the high voltage portion and the low voltage portion. The junction termination, which is an area for isolation between the high voltage portion and the low voltage portion, must have a sufficiently large width to ensure the reliability of high voltage integrated circuits.

In particular, the width of the isolation area between power semiconductor devices must be maximal in order to obtain a sufficiently high breakdown voltage (e.g., 600V or greater) and prevent punch-through due to the extension of depletion regions. Because of this restriction on the width of the isolation area, only CMOS process rather than BiCMOS process has been used in the manufacture of high voltage integrated circuits.

BRIEF SUMMARY OF THE INVENTION

In accordance with the present invention, a high voltage integrated circuit has a low voltage region separated from a high voltage region by a junction termination. A transistor in the high voltage region is surrounded by an isolation region having a low doping concentration. The use of a low-doped isolation region increases the size of an active region without reduction of a breakdown voltage.

In accordance with one aspect of the present invention, the high voltage integrated circuit has a bipolar transistor formed within the high voltage area using BiCMOS process without a reduction of breakdown voltage of the high voltage integrated circuit.

In one embodiment, the isolation region is of p-type and the transistor is formed in an n-type epitaxial layer formed over a substrate.

In another embodiment, the isolation region includes a lower isolation region and an upper isolation region. The lower isolation region extends from an upper surface of the substrate to a middle portion of the epitaxial layer. The upper isolation region extends from the middle portion of the epitaxial layer to an upper surface of the epitaxial layer.

In another embodiment, the bipolar transistor is an npn transistor.

BRIEF DESCRIPTION OF THE DRAWINGS

The nature and advantages of the present invention will become more apparent by the following detailed description and the attached drawings in which.

DETAILED DESCRIPTION OF THE INVENTION

Figure 1:
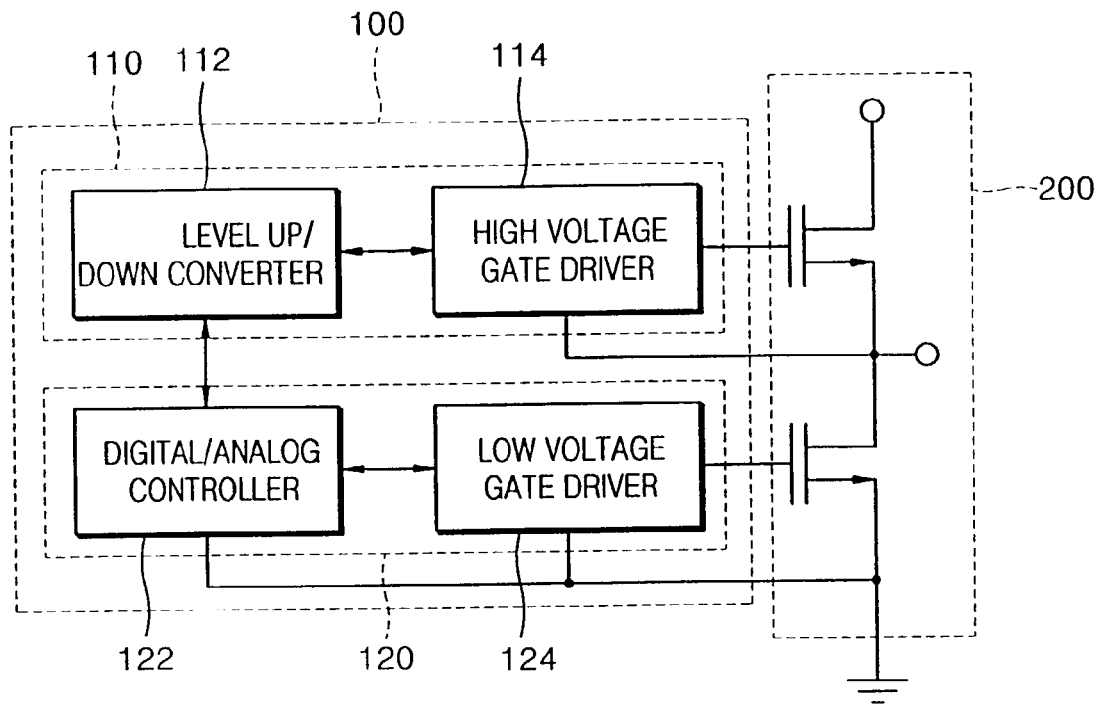
FIG. 1 is a block diagram illustrating chip division of a high voltage integrated circuit 100.

Referring to FIG. 1, a high voltage integrated circuit 100 includes a high voltage portion 110 and a low voltage portion 120. High voltage portion 110 includes a high voltage level up/down converter 112, for example, a 600V level up/down converter, and a high voltage gate driver 114. Low voltage portion 120 includes a digital/analog controller 122 and a low voltage gate driver 124. High voltage integrated circuit 100 is electrically connected to a load 200. Digital/analog controller 122 transmits and receives a control signal directly to and from low voltage gate driver 124 but, it transmits and receives a control signal to and from the high voltage gate driver 114 after the level of the control signal has been converted by level up/down converter 112. High voltage gate driver 114 and low voltage gate driver 124 apply different predetermined gate voltages, depending on their respective control signals, to the gate ports of the power devices of load 200.

Figure 2:
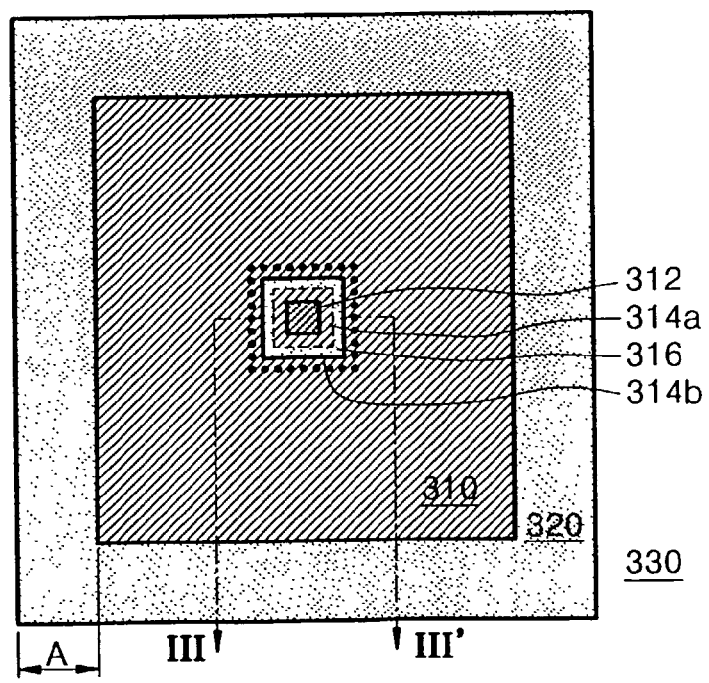
FIG. 2 is a top view of a high voltage integrated circuit according to the present invention.
Figure 3:
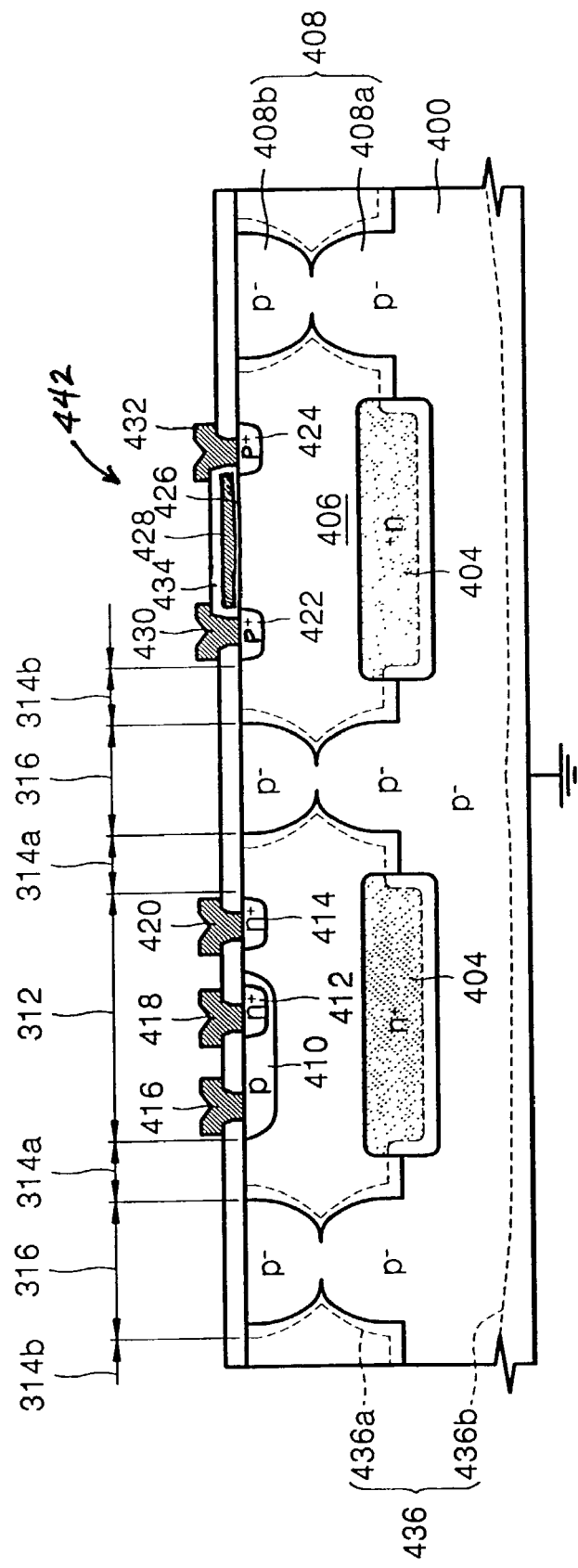
FIG. 3 is a cross sectional view of the high voltage integrated circuit of FIG. 2 along line III–III'.

FIG. 2 is a top view of a high voltage integrated circuit according to the present invention. FIG. 3 is a cross-sectional view of the high voltage integrated circuit of FIG. 2 along line III–III'. The same reference numerals in FIGS. 2 and 3 denote the same area or layer.

Referring to FIG. 2, the high voltage integrated circuit includes a high voltage island region 310 and a low voltage region 330 separated by a junction termination 320. Junction termination 320 surrounds high voltage island region 310. High voltage island region 310 has power semiconductor devices including a bipolar transistor 312. Bipolar transistor 312 is electrically isolated from the other devices by a p⁻-type isolation region 316. Reference numeral 314a denotes the region between isolation region 316 and the active region in which bipolar transistor 312 is formed. Reference numeral 314b denotes the region between isolation region 316 and the active region of other devices (e.g., MOSFET 442 in FIG. 3) in high voltage island region 310.

Referring to FIG. 3, an n-type epitaxial layer 406 is disposed on a p-type semiconductor substrate 400. An n⁺-type buried layer 404 is formed at the boundary between substrate 400 and epitaxial layer 406 directly under the active area. A p⁻-type lower isolation region 408a is formed between buried layers 404. A p⁻-type upper isolation region 408b is formed over lower isolation region 408a. The lower and upper isolation regions 408a, 408b are connected to each other to form a p⁻-type isolation region 408.

A bipolar transistor 312 and a MOS transistor 442 are formed in epitaxial layer 406 directly over the n⁺-type buried layer 404. Bipolar transistor 312 includes a p-type base region 410 formed in epitaxial layer 406, an n⁺-type emitter region 412 formed in base region 410, and a n⁺-type collector region 414 formed in epitaxial layer 406 a predetermined distance from the base region 410. Bipolar transistor 312 also includes a base electrode 416, an emitter electrode 418, and a collector electrode 420, which electrically contact base region 410, emitter region 412, and collector region 414, respectively. Base electrode 416, emitter electrode 418, and collector electrode 420 are electrically insulated from each other.

MOS transistor 442 is a PMOS transistor and includes a p⁺-type source region 422 and a p⁺-type drain region 424 separated by a channel region. A gate electrode 428 extends across the channel region and is insulated from the channel region by a gate insulating layer 426. A source electrode 430 and a drain electrode 432 electrically contact source region 422 and drain region 424, respectively. A dielectric layer 434 electrically insulates gate electrode 428, source electrode 430, and drain electrode 432 from each other.

Isolation regions 408 have a minimum doping concentration so that when the pn junction between the p-type isolation regions 408 and n-type epitaxial layer 406 is reverse biased, isolation regions 408 are completely depleted. A high breakdown voltage is thus achieved. That is, a depletion region defined by boundaries 436a and 436b extends into epitaxial layer 406 (boundary 436a) and into substrate 400 (boundary 436b) as shown in FIG. 3. The extent to which the depletion region extends into each of epitaxial layer 406 and substrate 400 is dependent upon the relative doping concentrations of the epitaxial layer 406 and substrate 400.

Because, substrate 400 and isolation regions 408 have lower doping concentration than epitaxial layer 406, the depletion region extends deeper into substrate 400 than it does into epitaxial layer 406. This results in isolation regions 408 being completely depleted while the depletion region extends a short distance into epitaxial layer 406. Because the depletion region extends only a short distance into epitaxial layer 406, spacings 314a, 314b can be made small without adversely impacting the punch-through characteristics of the device. At the same time, with isolation regions 408 fully depleted, a high breakdown voltage is achieved. Note that upper isolation region 408b can be optimized independent of lower isolation region 408a. For example, upper isolation region 408b can be designed to have a different doping concentration and/or width than those of lower isolation region 408a.

Figure 4A:
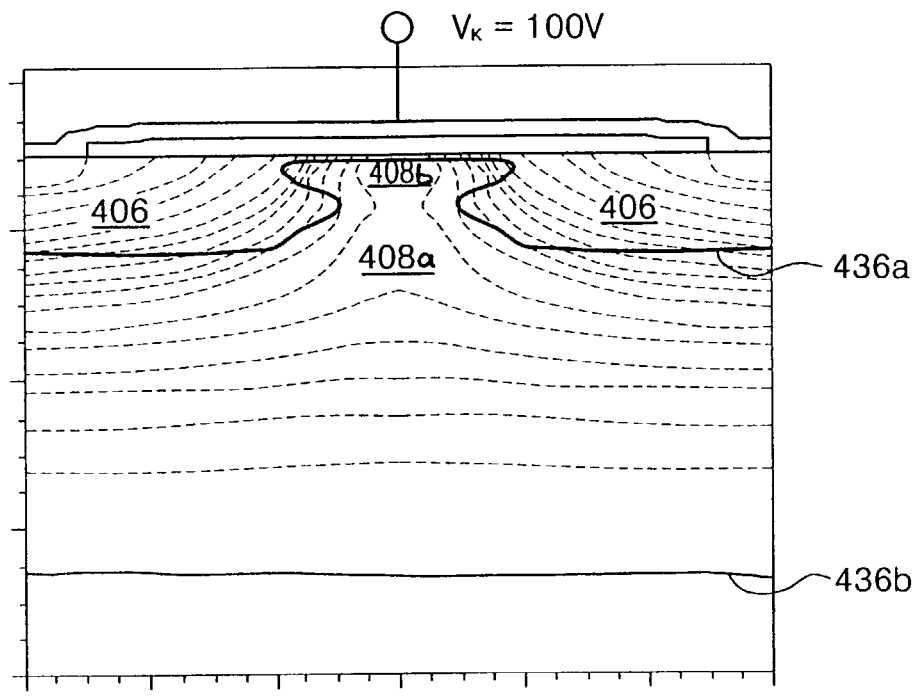
FIGS. 4A and 4B illustrate potential distributions and depletion regions when 100V and 700V are respectively applied to the high voltage integrated circuit of FIG. 3.
Figure 4B:
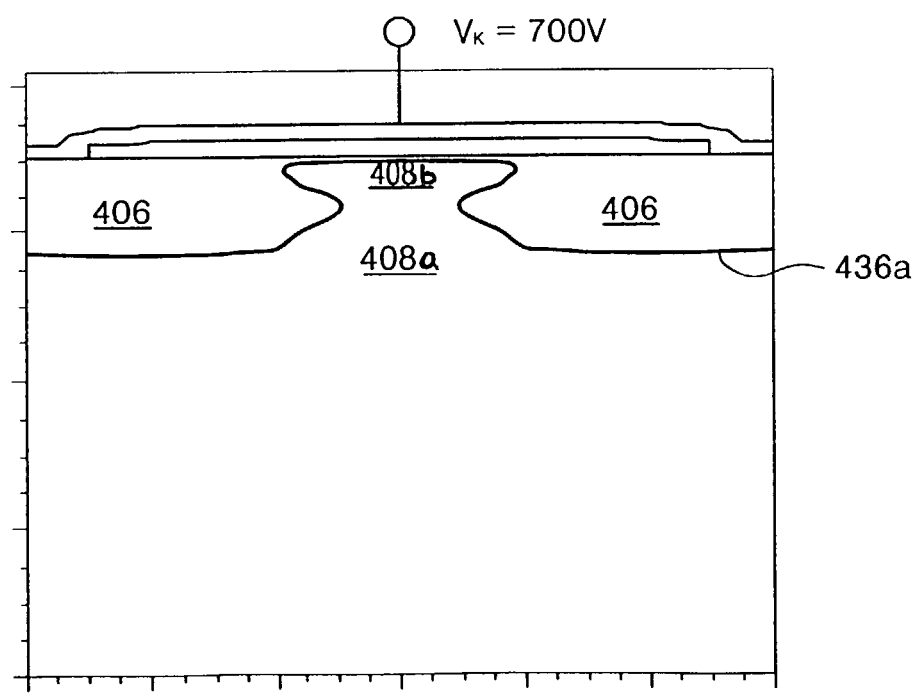

FIGS. 4A and 4B show simulation results, illustrating potential distributions and depletion regions around a p⁻-type isolation region when 100V and 700V are respectively applied to an exemplary embodiment of the high voltage integrated circuit of FIG. 3. The table blow shows the process and device parameters of the exemplary embodiment.

| Parameters | | Values |
|---|---|---|
| Resistivity | Substrate | 100 Ω cm |
| | n⁻ epi | 3 Ω cm |
| Junction depth | p⁻ body | 1 μm |
| | n⁺ source | 0.2 μm |

| Parameters | Values |
|---|---|
| Thickness of n⁻ epi | 5 μm |
| Drift length of LDMOS | 63 μm |
| Width of p⁻ isolation | 8 μm |
| BL to p⁻ isolation distance | 6 μm |
| p⁻ isolation (top and bottom) doping concentration | 6 × 10¹² cm⁻² |

Referring to FIG. 4A, when 100V is applied to the high voltage island relative to the substrate, lower isolation region 408a becomes fully depleted while the upper isolation region becomes partially depleted resulting in some electric field crowding at the junction between upper isolation region 408b and epitaxial layer 406. As shown, a flat depletion boundary 436b is formed near the bottom of substrate 400.

Referring to FIG. 4B, when 700V is applied, upper and lower isolation regions 408a, 408b, as well as substrate 400, are fully depleted. This prevents premature breakdown caused by electric filed crowding. Such high breakdown voltage is achieved even with short spacing between the isolation region and the high voltage island region contact because the isolation regions are lightly doped as compared to conventional techniques which use highly doped isolation regions.

Figure 5A:
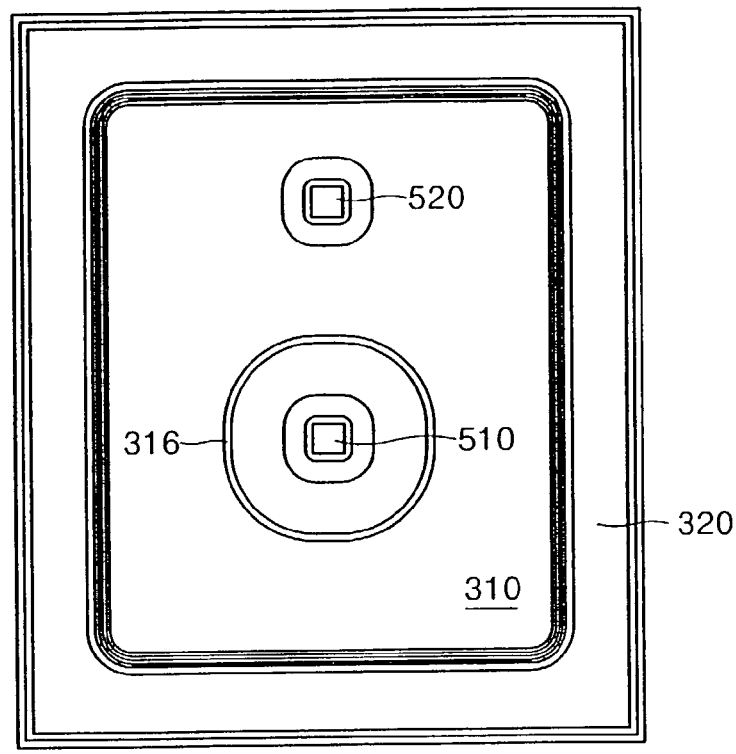
FIG. 5A is a top view of a test pattern for testing the voltage-current characteristic of a high voltage integrated circuit according to the present invention.
Figure 5B:
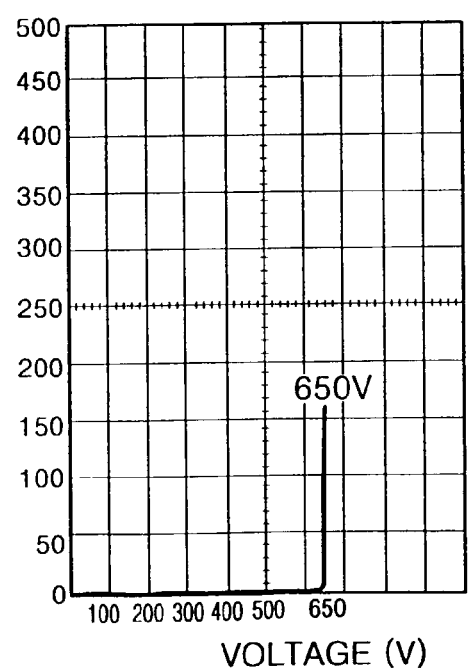
FIG. 5B is a graph showing the voltage-current characteristic of the test pattern of FIG. 5A.

FIG. 5A is a top view of a test pattern for testing the voltage-current characteristics of a high voltage integrated circuit according to the present invention. FIG. 5B is a graph showing the voltage-current characteristics of the high voltage integrated circuit using the test pattern of FIG. 5A.

The test pattern of FIG. 5A is formed so that p⁻-type isolation region 316 is formed within high voltage island area 310 which is in turn surrounded by junction termination 320. A first electrode 510 is provided to make electrical contact to the area inside the circular isolation region 316 and a second electrode 520 is provided to make electrical contact with the area outside the circular isolation region 316. When different bias is applied to the first and second electrodes 510, 520, the voltage-current characteristics as shown in FIG. 5B is obtained. As shown a high breakdown voltage of about 650V is obtained.

Figure 6A:
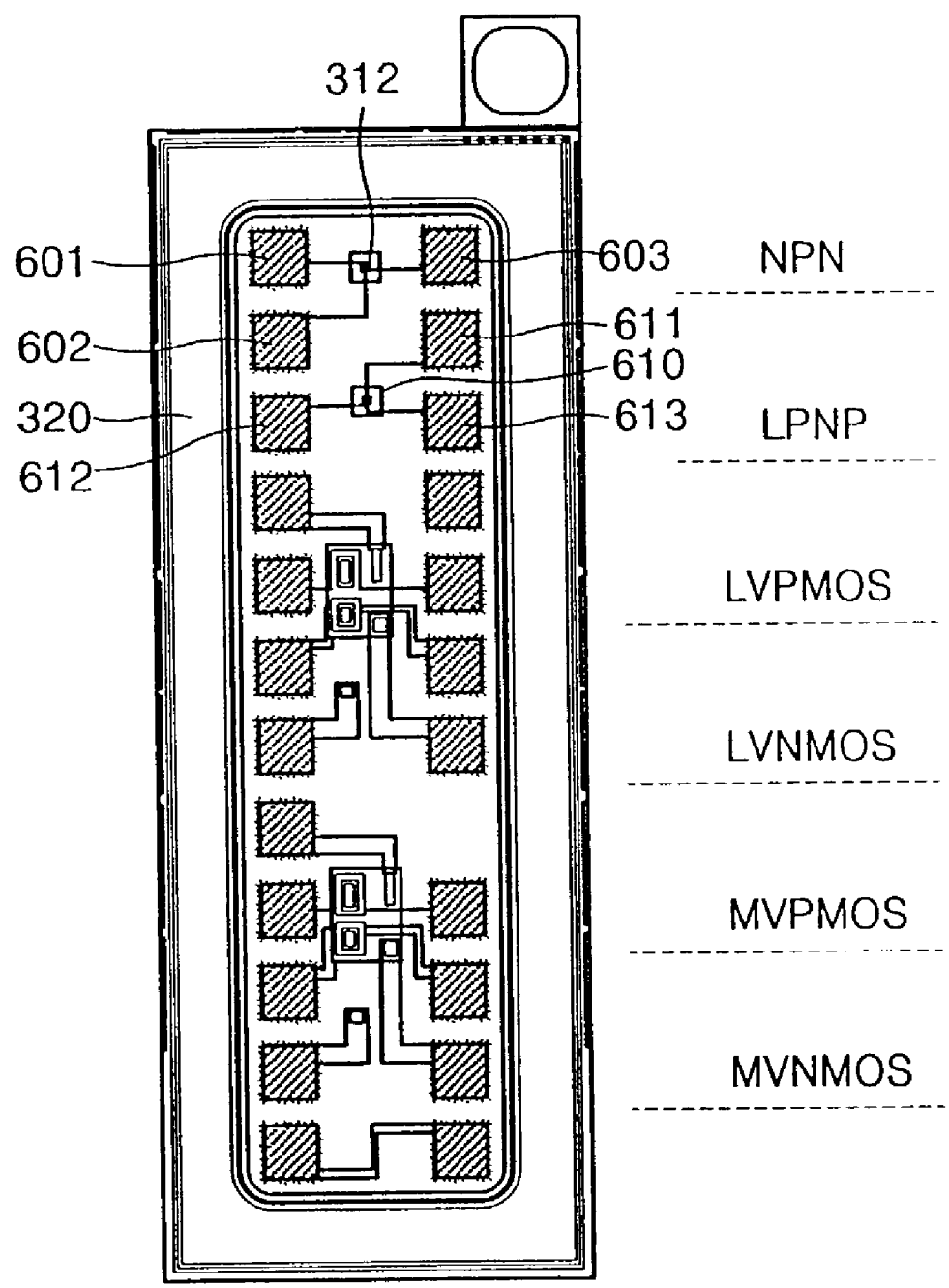
FIG. 6A is a top view of a test pattern for testing the DC current-gain characteristic of the bipolar transistor included in a high voltage integrated circuit according to the present invention.
Figure 6B:
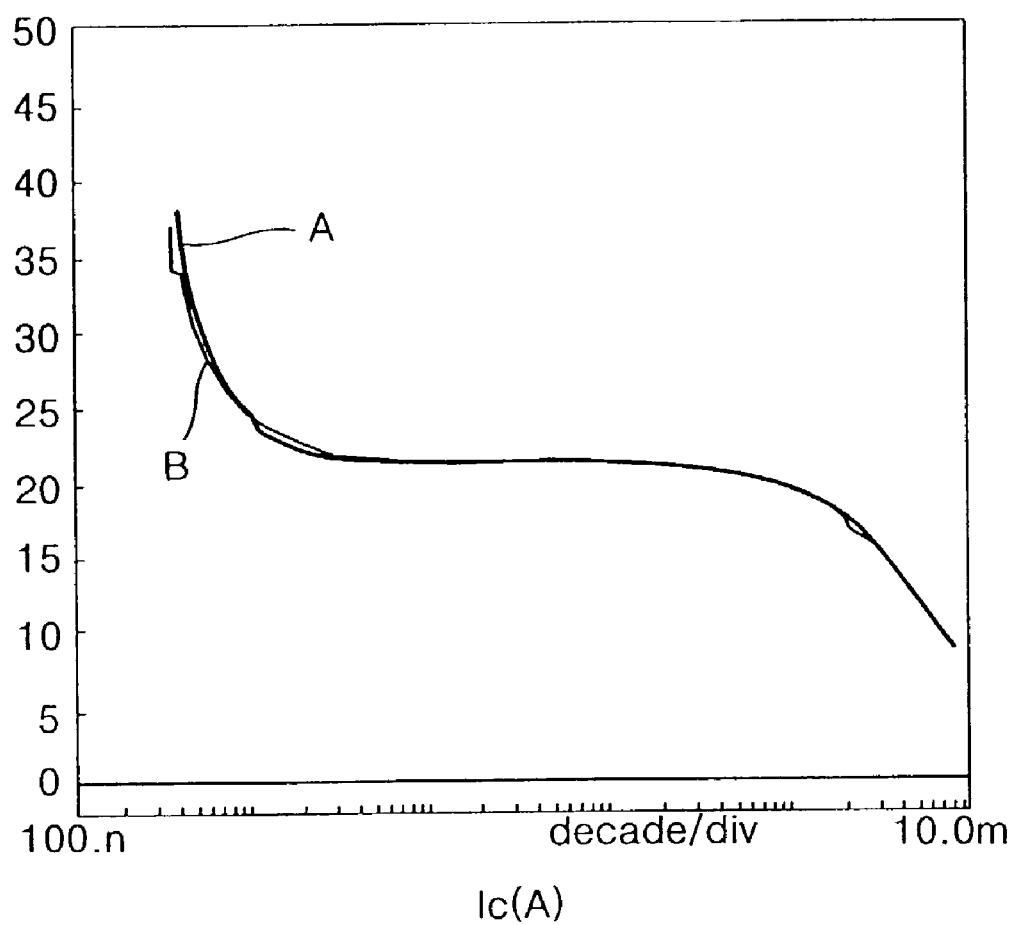
FIG. 6B is a graph showing the DC current-gain characteristic of the test pattern of FIG. 6A.

FIG. 6A is a top view of another test pattern for testing the DC current gain characteristics of the bipolar transistor included in a high voltage integrated circuit according to the present invention. FIG. 6B is a graph showing the DC current gain characteristics of the bipolar transistor included in a high voltage integrated circuit according to the present invention when the test pattern of FIG. 6A is subject to a test.

The test pattern of FIG. 6A is formed so that a high voltage region within the junction termination 320 has an npn bipolar transistor NPN 312, a lateral pnp bipolar transistor LPNP 610, a low voltage PMOS transistor LVPMOS, a low voltage NMOS transistor LVNMOS, a medium voltage PMOS transistor MVPMOS, and a medium voltage NMOS transistor MVNMOS. Each of npn bipolar transistor 312 and lateral pnp bipolar transistor 610 is surrounded by a p⁻-type isolation region (not shown). An emitter electrode pad 601, a collector electrode pad 602, and a base electrode pad 603 are connected to npn bipolar transistor 312. Likewise, an emitter electrode pad 613, a collector electrode pad 611, and a base electrode pad 612 are connected to lateral pnp bipolar transistor 610.

Referring to FIG. 6B, the DC current gain characteristics curve in case A where no bias is applied to the test pattern of FIG. 6A is nearly similar to that in case B where bias is applied thereto.

According to a high voltage integrated circuit of the present invention, as described above, the use of a low-doped p-type isolation region can increase the effective size of an active region without adversely impacting breakdown voltage such that a bipolar transistor can be formed within a high voltage island region. Thus, the BiCMOS process instead of a conventional CMOS process can be used to manufacture high voltage integrated circuits.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. An integrated circuit comprising:
   a substrate;
   an epitaxial layer over the substrate, the epitaxial layer having a predetermined doping concentration;
   a transistor formed in the epitaxial layer; and
   an isolation region extending through the epitaxial layer such that a portion of the epitaxial layer in which the transistor is formed is electrically isolated from other portions of the epitaxial layer, the epitaxial layer having a conductivity type opposite that of the substrate and the isolation region, the isolation region having a lower doping concentration than the predetermined doping concentration of the epitaxial layer such that a depletion region formed as a result of a reverse biased junction between the epitaxial layer and the isolation region extends a farther distance into the entire isolation region and the substrate than into the epitaxial layer.

2. The integrated circuit of claim 1 further comprising a high voltage region separated from a low voltage region by a junction termination, wherein the transistor is formed in the high voltage region.

3. The integrated circuit of claim 1 wherein the transistor is a bipolar transistor.

4. The integrated circuit of claim 1 wherein the isolation region and the substrate are of p-type conductivity and the epitaxial layer is of n-type conductivity.

5. The integrated circuit of claim 1 wherein the isolation region comprises an upper region and a lower region, the lower region extending from an upper surface of the substrate to a middle portion of the epitaxial layer, and the upper region extending from the middle portion of the epitaxial layer to an upper surface of the epitaxial layer.

6. The integrated circuit of claim 5 wherein the upper region and the lower region are in electrical contact, and the upper region has a different doping concentration than the lower region.

7. The integrated circuit of claim 6 wherein the upper region has a lower doping concentration than the lower region.

8. A high voltage integrated circuit comprising:
   a high voltage region separated from a low voltage region by a junction termination;
   an epitaxial layer of n-type conductivity over a substrate of p-type conductivity, the epitaxial layer having a predetermined doping concentration;
   a transistor formed in the epitaxial layer in the high voltage region; and
   an isolation region of p-type conductivity extending through the epitaxial layer such that a portion of the epitaxial layer in which the transistor is formed is electrically isolated from other portions of the epitaxial layer, the isolation region having a lower doping concentration than the predetermined doping concentration of the epitaxial layer such that a depletion region formed as a result of a reverse biased junction between the epitaxial layer and the isolation region extends a farther distance into the entire isolation region than into the epitaxial layer.

9. The integrated circuit of claim 8 wherein the transistor is an npn bipolar transistor.

10. The integrated circuit of claim 8 wherein the isolation region comprises an upper region and a lower region, the lower region extending from an upper surface of the substrate to a middle portion of the epitaxial layer, and the upper region extending from the middle portion of the epitaxial layer to an upper surface of the epitaxial layer.

11. The integrated circuit of claim 10 wherein the upper region and the lower region are in electrical contact, and the upper region has a lower doping concentration than the lower region.

* * * * *